(12) United States Patent
Sze et al.

(10) Patent No.: US 7,518,171 B2
(45) Date of Patent: Apr. 14, 2009

(54) PHOTO DIODE AND RELATED METHOD FOR FABRICATION

(75) Inventors: Jhy-Jyi Sze, Tai-Nan (TW); Ming-Yi Wang, Taipei Hsien (TW); Junbo Chen, Tai-Chung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 452 days.

(21) Appl. No.: 11/379,228

(22) Filed: Apr. 19, 2006

(65) Prior Publication Data
US 2007/0249077 A1    Oct. 25, 2007

(51) Int. Cl.
*H01L 31/062* (2006.01)
*H01L 31/113* (2006.01)

(52) U.S. Cl. .................. 257/292; 257/431; 257/462; 257/288

(58) Field of Classification Search .......... 257/431, 257/432, 439, 443, 444, 461, 463, 232, 46, 257/106, 233, 462, 291–292
See application file for complete search history.

(56) References Cited

U.S. PATENT DOCUMENTS

| | | | |
|---|---|---|---|
| 6,015,993 A * | 1/2000 | Voldman et al. ............ 257/355 |
| 6,171,882 B1 | 1/2001 | Chien | |
| 6,534,356 B1 | 3/2003 | Yang et al. | |
| 6,756,616 B2 * | 6/2004 | Rhodes ..................... 257/291 |
| 6,764,892 B2 * | 7/2004 | Kunz et al. ................. 438/217 |
| 7,385,238 B2 * | 6/2008 | Mouli ....................... 257/292 |
| 2005/0051702 A1 | 3/2005 | Hong | |
| 2005/0110060 A1 | 5/2005 | Shiu | |

FOREIGN PATENT DOCUMENTS

| | | |
|---|---|---|
| CN | 2906930 Y | 5/2007 |
| DE | 10022660 | 11/2001 |
| KR | 2004/0011066 | 2/2004 |

* cited by examiner

*Primary Examiner*—Chuong A. Luu
(74) *Attorney, Agent, or Firm*—Winston Hsu

(57) ABSTRACT

A method for fabricating a photo diode first involves providing a substrate. A doping area is then formed on the substrate. Afterwards, a dielectric layer, and a first poly-silicon layer are formed on the substrate. An opening is then formed to expose a surface of the doping area. A second poly-silicon layer is formed on the first poly-silicon layer and within the opening. The second poly-silicon layer is patterned to form a wire, while the first poly-silicon layer is patterned to form a gate. Finally, a source/drain is formed.

10 Claims, 6 Drawing Sheets

PHOTO DIODE AND RELATED METHOD FOR FABRICATION

BACKGROUND OF THE INVENTION

1. Field of the Invention

The present invention relates to a photo diode and a related method for fabrication. More particularly, a photo diode for an active pixel sensor (APS) is presented, along with a related fabrication method.

2. Description of the Prior Art

Active pixel sensors are commonly used as solid image sensors. The active pixel sensors comprise of complimentary metal-oxide semiconductors (CMOS), and are also referred to as CMOS image sensors. CMOS image sensors are manufactured by traditional semiconductor manufacturers, and have lower costs and smaller sizes than regular image sensors. Therefore, applications of CMOS image sensors have been gradually replacing charge-coupled devices (CCD) over time. Furthermore, CMOS image sensors have high quantum efficiency and low read-out noise, making its usage popular with PC cameras and the digital cameras.

A general active pixel sensor comprises a plurality of active pixel sensor units. Each active pixel sensor unit further comprises a photo diode for sensing light, and three metal-oxide semiconductors. The metal-oxide semiconductors respectively serve as a reset transistor for resetting a MOS, a current source follower transistor for following a current source, and a row-select transistor for selecting a row. The photo diode sends signal data according to photo current from the photo sensor area. For example, light current serves as signal data which is generated when the photo sensor area is illuminated, and dark current is noise which is generated when the photo sensor area without light. Therefore, the photo diode utilizes the magnitude of the signal or noise to generate the signal data.

Please refer to FIG. 1. FIG. 1 is a schematic diagram of a photo diode according to the prior art. According to FIG. 1, a photo diode 100 comprises a P type substrate 102, with an oxide layer 104 made from $SiO_2$ formed onto the P type substrate 102. The P type substrate 102 comprises a plurality of shallow trench isolations (STI) 106, a photo sensor area 108, a gate 112, source/drain extended areas 114, and source/drain areas 116. The source/drain extended areas 114 are located between the two STIs 106. The photo sensor area 108 comprises doping areas 118, 120. The doping area 118 has a low concentration of N dopant, and the doping area 120 has high concentration of N dopant, with arsenic (As) typically utilized as the dopant. The N dopant within the doping area 118 and the P type substrate form a PN junction. The PN junction and the P type substrate 102 form a depletion region to sense the current.

One of the shortcomings with the photo diode 100 according to the prior art is that the crystal grain in the surface of the photo sensor area 108 is easily damaged through a high dose of N dopant in the ion implanting process. Furthermore, in continuous contact plug manufacturing, the etching for buried contact (BC) windows easily causes damage to the surface of the doping area 120. When titanium (Ti) in the contact plug reacts with the silicon in the substrate, TiSi will be produced. The above situation can thus cause excess currents inadvertently increasing noise, and subsequently decreasing the sensitivity of the photodiode.

Furthermore, the PN junction in the photo sensor area 108 of the photo diode 100 according to the prior art is disposed within a deep area. If a short wavelength (e.g. blue light) reaches the photo diode 100, it may not be able to sufficiently penetrate the substrate, causing the PN junction of the photo diode 100 to generate an insufficient current. Therefore, the photo diode 100 possesses a low photosensitivity for short wavelength light.

SUMMARY OF THE INVENTION

The present invention provides a photo diode and a related fabrication method to solve the above-mentioned problems.

According to the present invention, a method for fabricating a photo diode is provided. First, a substrate is provided, with a plurality of insulation layers within the substrate. Then a doping area is formed in the substrate surrounded by insulation layers. A dielectric layer is then formed on the substrate. Afterwards, a first poly-silicon layer is formed on the dielectric layer. The first poly-silicon layer and the dielectric layer are then etched to form an opening that exposes a surface of the doping area. A second poly-silicon layer is formed on the first poly-silicon layer and the opening, patterning the second poly-silicon layer to form a wire on one side of the doping area. The first poly-silicon layer is patterned to form a gate on the side of the doping area, being different from the side of the wire, forming a source/drain in one side of the gate.

According to the present invention, a photo diode is presented. The photo diode includes a substrate, a dielectric layer on the substrate, and a plurality of insulation layers within the substrate. A doping area is found in the substrate being surrounded by insulation layers. A gate is located on the dielectric layer, with the gate being on one side of the doping area. Additionally, a poly-silicon section is on the dielectric layer, with a poly-silicon section located on another side of the doping area being different than the side of the gate. Furthermore, an opening is formed in the poly-silicon section and the dielectric layer to reach the surface of the doping area. A patterned poly-silicon layer is in the opening and on part of the poly-silicon section, and a source/drain is on one side of the doping area, being different from the side of the gate and the substrate.

Because the present invention etches the poly-silicon layer and the oxide layer through different etching processes to form a buried contact window, the surface of the doping area on the substrate remains intact. Additionally, the present invention utilizes implanted poly-silicon as the material of the contact plug and the wire to prevent a reaction with the substrate, such that TiS won't be formed as in the prior art. Furthermore, the wire made form the implanted poly-silicon has higher transparency for light than the metal material, increasing the sensitivity of the photo sensor.

The surface of the doping area is formed on P type doping area, with the intersection of the P type doping area and the N type doping area forming a PN junction. The PN junction is located closer to the surface of the photo sensor area, further increasing the photo sensitivity to short wavelength light. Furthermore, the P type doping area is formed between the gate and the wire, allowing the size of the P type doping area to be accurately controlled. This further prevents the P type doping area from having light/dark current. The surface of the P type doping area is protected through the oxide layer, preventing it from being easily damaged. Finally, when the reset transistor performs a reset, the N type dopant in the doping area of the photo diode pinches off to decrease noise generated from the reset and to increase the signal/noise.

These and other objectives of the present invention will no doubt become obvious to those of ordinary skill in the art after

DETAILED DESCRIPTION

Figure 1:
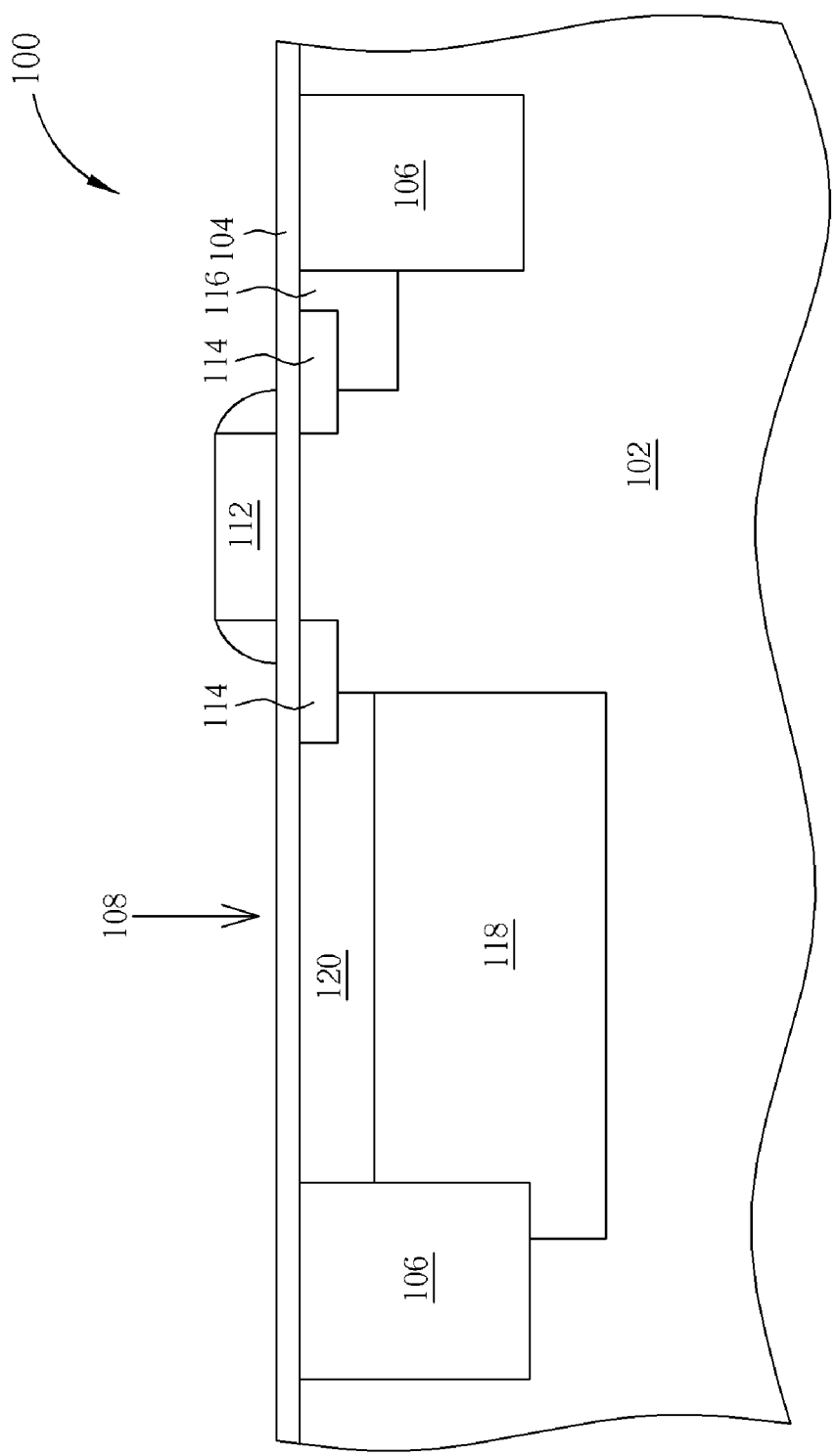
FIG. 1 is a schematic diagram of the photo diode according to the prior art.
Figure 2:
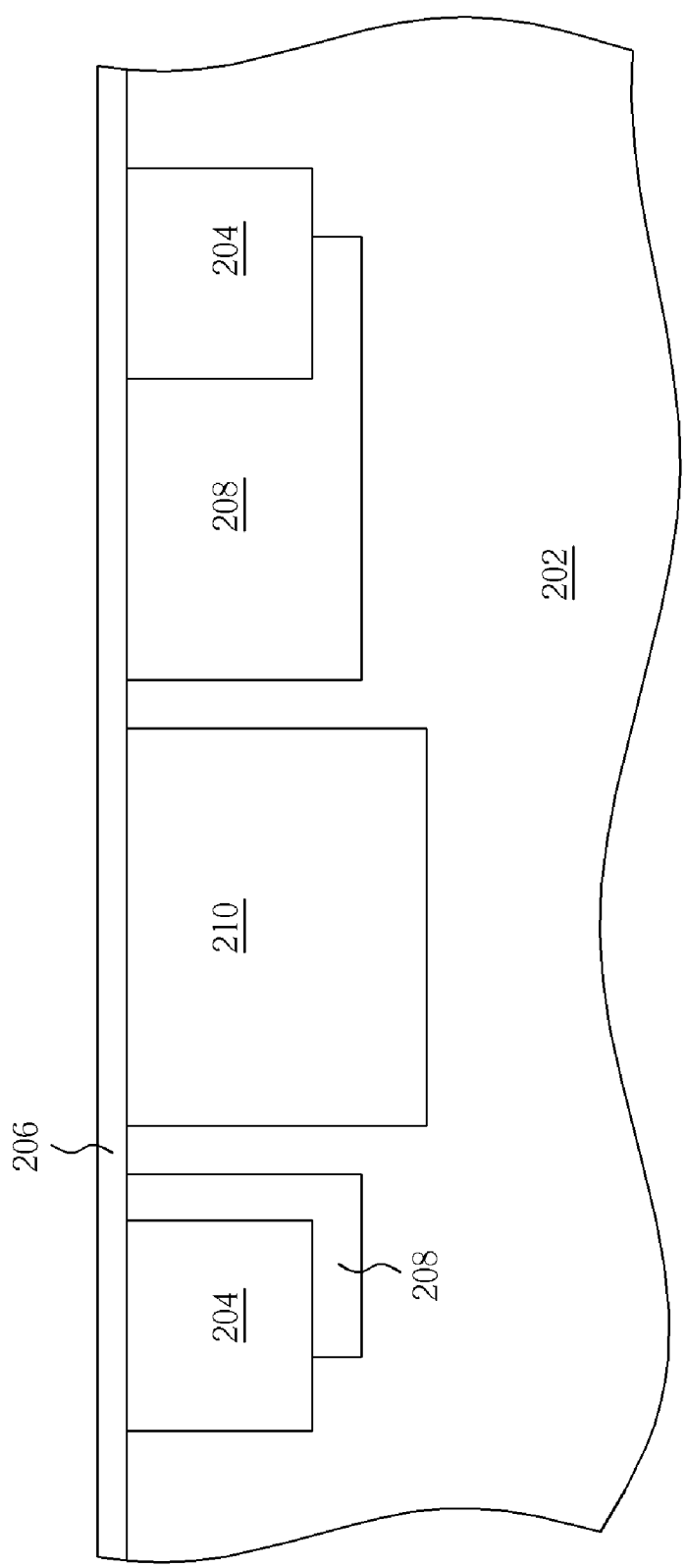
FIGS. 2-5 are schematic diagrams illustrating a fabrication method for a photo diode according to an embodiment in the present invention.

Please refer to FIGS. 2-5. FIGS. 2-5 are schematic diagrams of a fabrication method for a photo diode according to an embodiment in the present invention. As FIG. 2 shows, a P type substrate 202 is used. A plurality of STIs 204 are then formed in the P type substrate 202, subsequently forming a dielectric layer on the surface of the P type substrate 202 (e.g. an oxide layer 206 made form $SiO_2$). A patterned photoresist layer (not shown) is spun during the photolithography process, followed by an ion implanting process to form P type guard rings (GR) 208 on the inner sides of the STIs 204. The P type GRs 208 are deeper than the STI s 204 to decrease light current in the photo diode, and to increase signal/noise. Next, the patterned photoresist layer is removed, which reveals the P type GRs 208, followed by another ion implanting process to form a doping area 210. The doping area 210 has low concentration of N dopant. Those skilled in the art understand that the present invention is not necessarily limited to fabrication on a P type substrate 202, but can be fabricated using any silicon substrate with a P type well.

Figure 3:
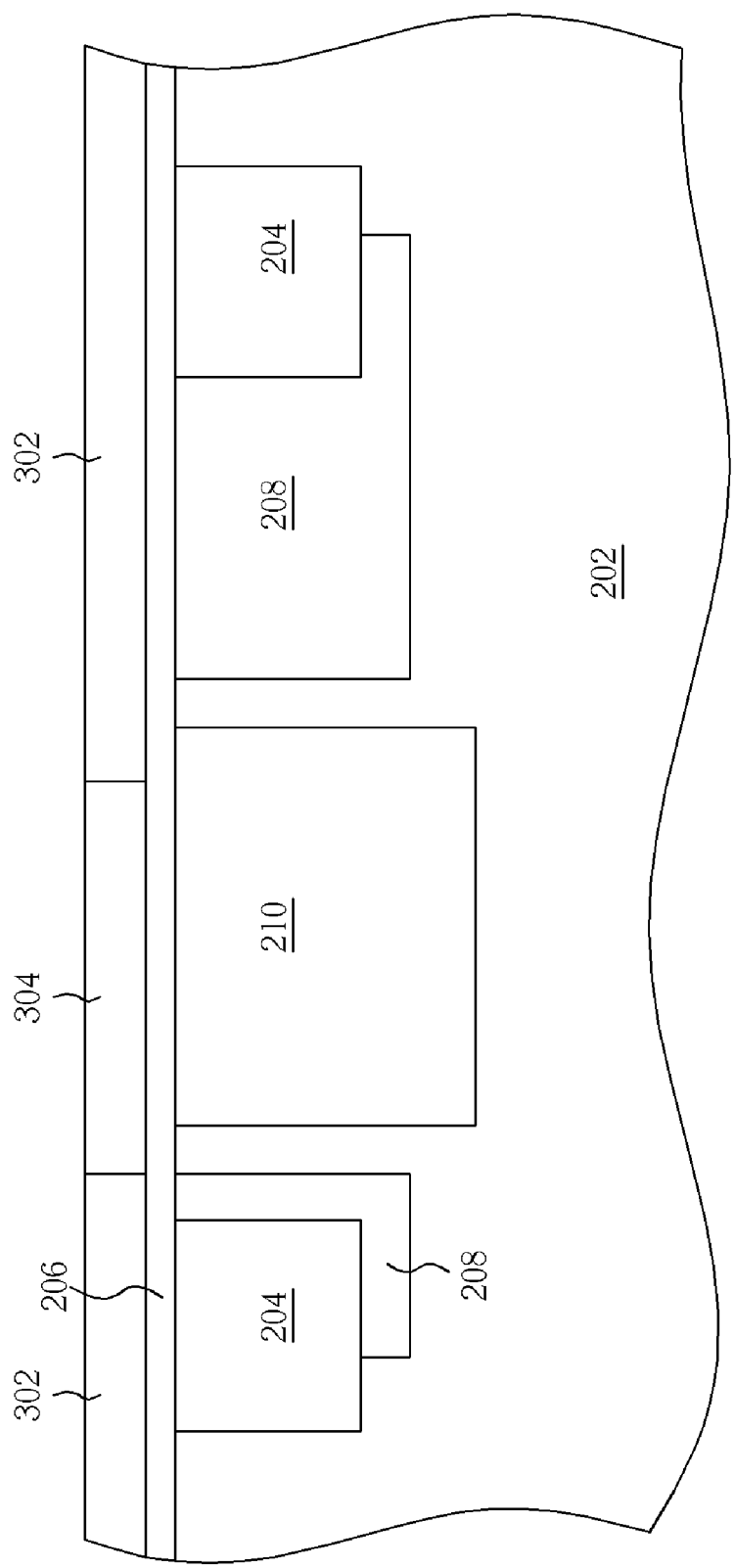

Please refer to FIG. 3. FIG. 3 illustrates the doping of a non implant poly-silicon layer (not shown) on the surface of the oxide layer 206. A patterned photoresist layer (not shown) is formed during the photolithography process. Afterwards, an ion implanting process is performed to implant N type dopant (not shown) into the non implanted poly-silicon layer (not shown). This forms a doped poly-silicon section 302. Please note that a portion of poly-silicon on the doping area 210 isn't doped with the N dopant in order to retain a non implanted poly-silicon section 304.

Figure 4:
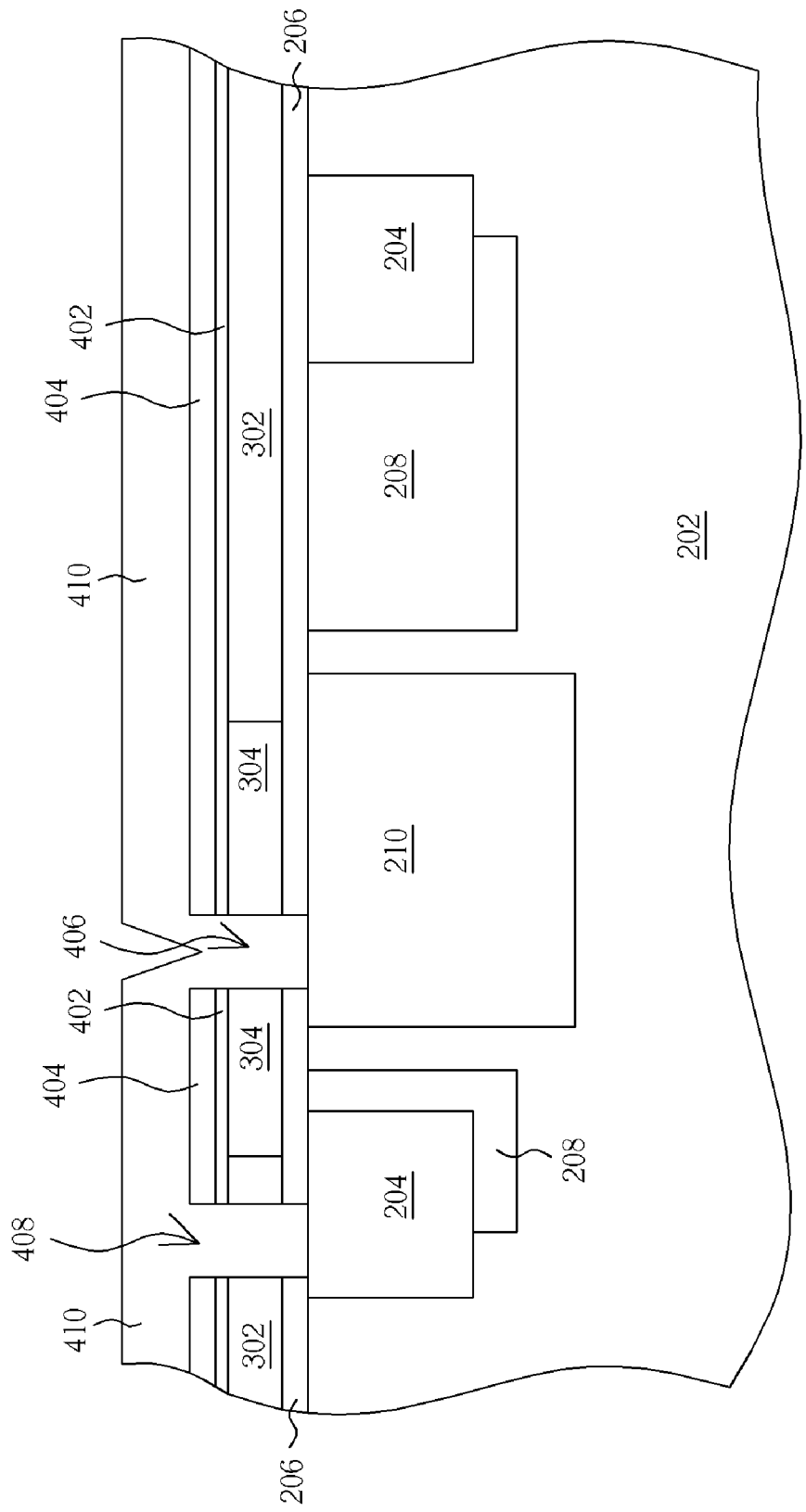

Please refer to FIG. 4. An anti-reflection (AR) layer 402 and an oxide layer 404 are implanted on poly-silicon section 302 and non-implanted poly-silicon section 304. A patterned mask layer (not shown) using photoresist is then formed. Part of the oxide layer 404, the AR layer 402, the implanted poly-silicon section 302, the non implanted poly-silicon section 304, and the oxide layer 206 are then etched to form openings 406, 408 used for buried contact windows. The opening 406 exposes the surface of the doping area 210. Please note that in this embodiment, the method for forming the openings 406, 408 is utilized a repeatedly for the etching processes. For example, at least one dry etching process is performed to the implanted poly-silicon section 302, and the non implanted poly-silicon section 304. This is made from poly-silicon, with the oxide layer 206 being the etch stop layer.

Subsequently, a wet etching process is performed to remove the oxide layer 206 void of the patterned mask (not shown) layer in order to form openings 406, 408. Because the non implanted poly-silicon layer 304 and the oxide layer 206 in the opening 406 are etched through different etching process, the wet etching process for the oxide layer 206 doesn't etch the P type substrate 202 through appropriate selection. In addition, the surface of the doping area 210 isn't damaged, unlike a dry etching process such as plasma etching which causes defects and light current. Next, a implanted poly-silicon layer 410 is doped on the surface of the oxide layer 404, with the implanted poly-silicon layer 410 filling the openings 406, 408. The implanted poly-silicon layer 410 in the openings 406, 408 forms the contact plugs.

Figure 5:
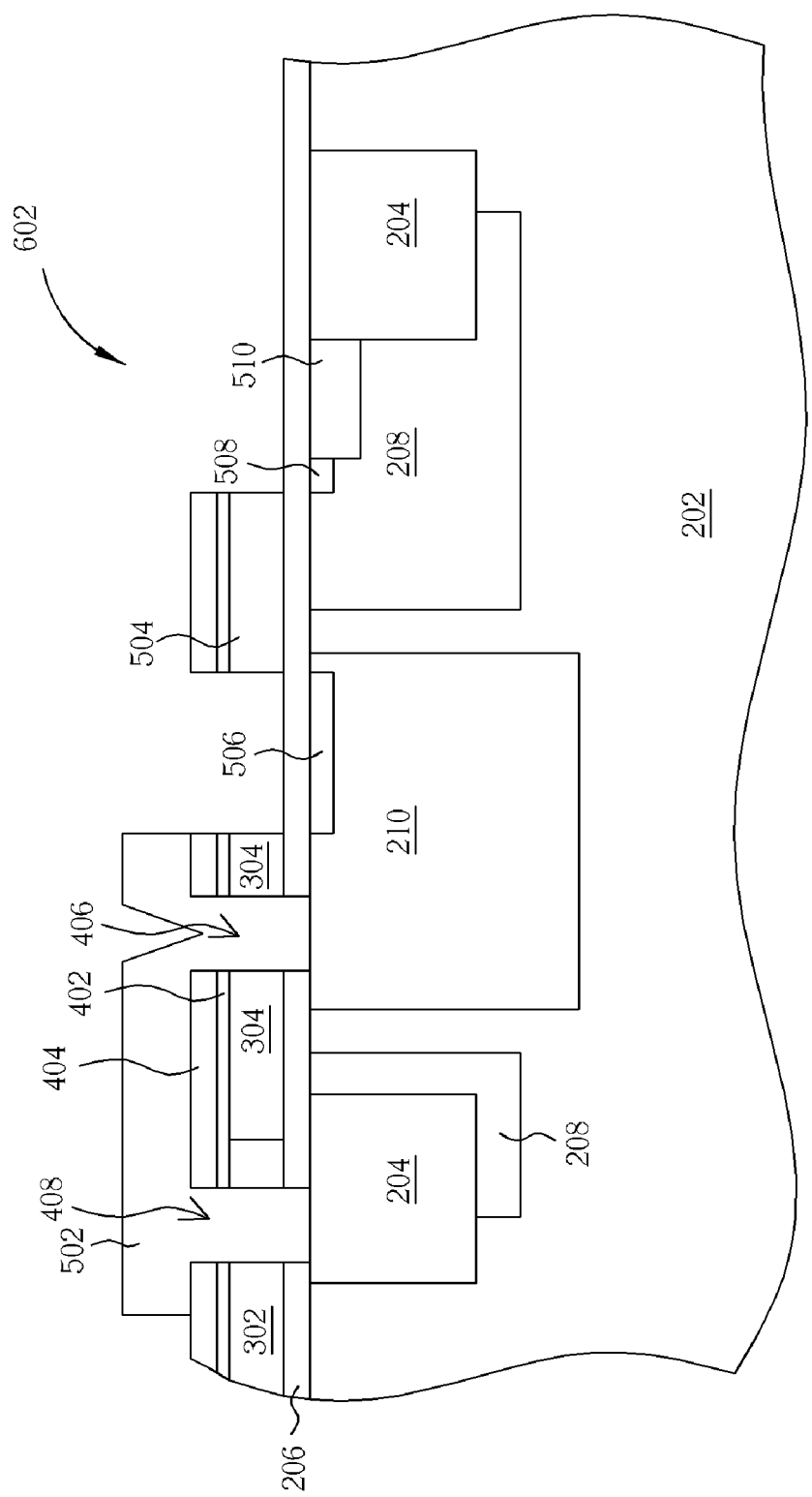

Please refer to FIG. 5. A patterned photoresist layer (not shown) is formed through the photolithography process. An etching process is then performed to the implanted poly-silicon layer 410, with the oxide layer 404 being the etch stop layer. This results in the patterned implanted poly-silicon layer 410 forming a wire 502 for connecting other components. After removing the patterned photoresist layer (not shown), another patterned photoresist layer (not shown) is spun in the photolithography process for etching part of the oxide layer 404 and the AR layer 402. Then, the patterned oxide layer 404 and the AR layer 402 are utilized as a mask (not shown) for etching the implanted poly-silicon section 302, the non implanted poly-silicon section 304. The etching stops at the surface of the oxide layer 206 to only pattern the implanted poly-silicon section 302 and the non implanted poly-silicon section 304. Subsequently, the part of the implanted poly-silicon section 302 that remains un-etched forms a gate 504 on one side of the doping area 210. According to the present embodiment, the method of patterning the implanted poly-silicon section 302 and non implanted poly-silicon section 304 is completed through a wet etching or dry etching process. The wet etching process, however, is recommended. This is because the etching process stops at the surface of the oxide layer 206 such that the surface of doping area 210 does not get damaged, and prevents generation of the light current.

In the next step, a patterned photoresist layer is created for an ion implant process to form a P type doping area 506 on the surface of the doping area 210 no covered by the gate 504 and the wire 502. A different patterned photoresist layer is then used to perform individual ion implant processes to form a source/drain extended area 508, and a source/drain 510 on one side of the doping area 210 different form the side of gate 504. After the above process, a photo diode 602 according to the present invention is completed. The doping area 210 not containing gate 504 cover, the wire 502, and the undoped poly-silicon section 304 are the photo sensor areas. The photo diode 602 connects with the other components through the wire 502 in order to form an active pixel sensor unit.

Figure 6:
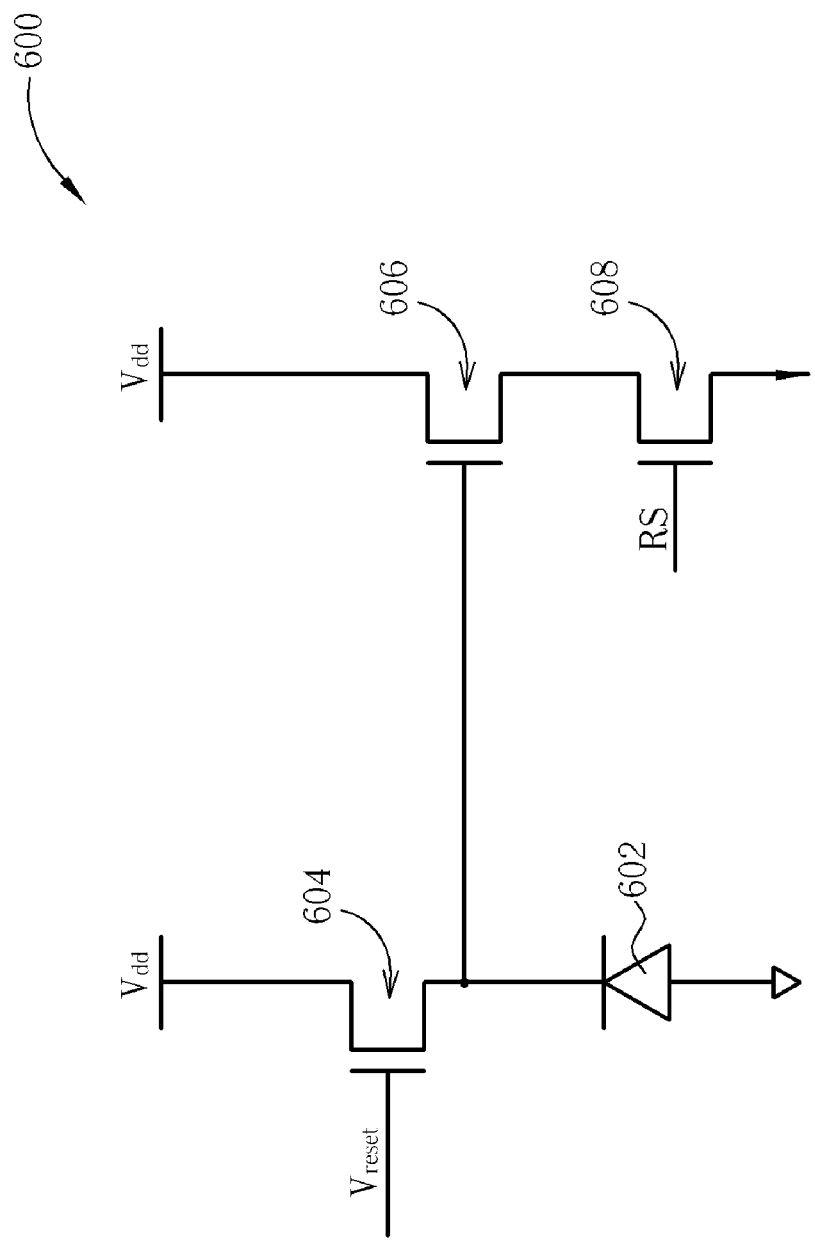
FIG. 6 is a schematic diagram of the active pixel sensor unit according to the present invention.

Please refer to FIG. 6. FIG. 6 is a schematic diagram of the active pixel sensor unit according to the present invention. The active pixel sensor unit 600 utilizes the photo diode 602 described above as a photo sensor. The active pixel sensor unit 600 includes a photo diode 602, a reset transistor 604, a current source follower transistor 606, and a row-select transistor 608. A source/drain of the reset transistor 604 electrically connects with the photo diode 602, and a gate of current source follower transistor 606. When the active pixel sensor unit 600 operates, it is utilized to open or close the reset transistor 604 to reset the voltage of the photo diode 602. This calculates the signal/noise in the real time in order to deal with the photo sensor signal. Please note that the current in the doping area of the photo diode according to the present invention will be pinched off when the reset transistor 604 performs a reset to restrain noise. However, the N dopant in the doping area will generate current again at the next occurrence of oncoming light.

Because the method of the present invention etches the poly-silicon layer and the oxide layer through different etching processes to form a buried contact window, the surface of the doping area in the substrate will not be subjected to damage. Additionally, the present invention utilizes an implanted poly-silicon as the contact plug and wire material. This prevents the contact plug from reacting with the substrate, preventing the forming of TiS as described in the prior art. Furthermore, the wire made form the implanted poly-silicon has a higher light transparency than the metal material, increasing the light sensitivity photo sensor.

The surface of the doping area according to the present invention is formed on the P type doping area, with the intersection of the P type doping area and the N type doping area forming a PN junction. The PN junction is located closer to the surface of the photo sensor area, increasing the photo sensitivity for short wavelength light. Furthermore, the P type doping area is formed between the gate and the wire, allowing the size of the P type doping area to be accurately controlled. The P type doping area also won't possess light or dark current. The surface of the P type doping area is protect by the oxide layer, drastically reducing its susceptibility to damage. Finally, when the reset transistor performs a reset, the N dopant in the doping area of the photo diode, being fabricated according to the present invention, pinches off to decrease noise caused from the reset and to increase the signal/noise.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photo diode comprising:
   a substrate;
   a dielectric layer on the substrate;
   a plurality of insulation layers within the substrate;
   a doping area in the substrate surrounded by the insulation layers;
   a gate on the dielectric layer being on a first side of the doping area;
   a poly-silicon section on the dielectric layer being on a second side of the doping area, the second side being different from the first side;
   an opening in the poly-silicon section and the dielectric layer, the opening exposing a surface of the doping area;
   a patterned poly-silicon layer in the opening and on part of the poly-silicon section; and
   a source or drain on a side of the doping area and in the substrate, the side being different from the first side and the second side.

2. The photo diode of claim 1, wherein the substrate is a P type substrate.

3. The photo diode of claim 2, wherein the doping area is an N type doping area.

4. The photo diode of claim 3, wherein the photo diode further comprises a P type doping area on the surface of the doping area.

5. The photo diode of claim 1, wherein the insulation layers are shallow trench isolations.

6. The photo diode of claim 5 further comprising a plurality of guard rings on one side of each shallow trench isolation near the doping area.

7. The photo diode of claim 1, wherein the gate comprises implanted poly-silicon.

8. The photo diode of claim 1, wherein the patterned poly-silicon layer comprises implanted poly-silicon.

9. The photo diode of claim 8, wherein the opening is a buried contact window.

10. The photo diode of claim 9, wherein the patterned poly-silicon layer in the opening is a contact plug.

* * * * *